United States Patent [19]

Tanaka et al.

[11] 4,412,900

[45] Nov. 1, 1983

[54] METHOD OF MANUFACTURING PHOTOSENSORS

[75] Inventors: Yasuo Tanaka, Kokubunji; Akira Sasano, Hinodemachi; Toshihisa Tsukada, Tokyo; Yasuharu Shimomoto, Hinodemachi, all of Japan

[73] Assignee: Hitachi, Ltd., Tokyo, Japan

[21] Appl. No.: 357,076

[22] Filed: Mar. 11, 1982

[30] Foreign Application Priority Data

Mar. 13, 1981 [JP] Japan ................................. 56-35313
Oct. 21, 1981 [JP] Japan ................................. 56-16720

[51] Int. Cl.³ ............................................ C23C 15/00
[52] U.S. Cl. ................................. 204/192 P; 204/298
[58] Field of Search ..................................... 204/192 P

[56] References Cited

U.S. PATENT DOCUMENTS 3,798,146 3/1974 Wan et al. ...................... 204/192 P
4,227,078 10/1980 Yamamoto ......................... 250/227
4,233,506 11/1980 Yamamoto ......................... 250/227
4,265,991 5/1981 Hirai et al. ...................... 204/192 P

FOREIGN PATENT DOCUMENTS 51-10715 1/1976 Japan .

*Primary Examiner*—Arthur P. Demers
*Attorney, Agent, or Firm*—Antonelli, Terry & Wands

[57] ABSTRACT

A method of manufacturing photosensors is disclosed which comprises the steps of forming a photo-conductor film made chiefly of silicon and containing hydrogen on a desired substrate, forming a transparent conductive film on the photo-conductor film by sputtering, and heating the photosensor having the sputtered transparent conductive film at least at 140° C. and not higher than 280° C. The heat treatment is performed preferably at a temperature between 170° to 250° C., at which greater effect will be provided. This heat treatment remarkably improves the photo-response speed.

27 Claims, 24 Drawing Figures

METHOD OF MANUFACTURING PHOTOSENSORS

This invention relates to a method of manufacturing photosensors using hydrogenated amorphous silicon, and particularly to a method of manufacturing a photosensor which includes a substrate, a lower electrode, a photoconductor layer of amorphous or noncrystalline material made chiefly of silicon and containing hydrogen (i.e. hydrogenated amorphous silicon), and a transparent electrode formed by sputtering. There is known a one-dimentional photosensor in which opaque metal electrodes are formed in a one-dimensional array on an insulating substrate, amorphous material made chiefly of silicon and containing hydrogen is deposited on the metal electrodes to form a photoconductor layer including n+-type layer, i- or n-type layer and p-type layer (hereinafter, referred to as hydrogenated amorphous silicon photodiode) formed on the substrate in this order, and a transparent electrode is formed on the photoconductor layer.

Typical photosensors of this kind are disclosed in U.S. Pat. No. 4,227,078, and U.S. Pat. No. 4,233,506.

There is also known a solid-state image sensor, in which a plurality of solid state elements each having a photoelectric converting function and a signal accumulating function are arranged, as picture elements (pixels), in an image sensing plane, which is scanned in sequence to produce an electrical signal converted from an external picture information. In particular, the photoconductor layer forming the image sensing plane is formed to cover a scanning IC substrate in which switches, scanning circuits and so on are formed.

Such solid-state image sensor in which the photoconductor layer, working as an image sensing plane covers the semiconductor substrate having switches, scanning circuits and so on formed therein, is disclosed in Japanese Patent Laid-open Specification No. 10715/1976.

These photosensors normally have a transparent conductive film on the photoconductor layer. This transparent conductive film is desirably formed by sputtering.

However, after a desired pattern of electrode and photodiodes of hydrogenated amorphous silicon are formed on the substrate, when a transparent electrode of indium oxide-tin oxide system, or a semi-transparent electrode of platinum or the like is formed on the hydrogenated amorphous silicon layer, the photo-response of the photodiode is deteriorated.

The sputtering of a transparent electrode of, for example, indium oxide-tin oxide (ITO) system metal oxide or a semi-transparent metal electrode of gold or platinum is performed to increase the adhesion to the photodiode of hydrogenated amorphous silicon. The increase of adhesion is required particularly in the one-dimensional photosensor or solid-state image sensor.

Although a transparent electrode of oxide or a semi-transparent electrode of metal can be formed by vacuum evaporation process, the film formed by evaporation process is generally inferior, in its adhesion to the underlying film, to that formed by sputtering.

It is an object of this invention to provide a method of manufacturing a photosensor comprising the steps of forming a photoconductor film of amorphous material mainly comprising silicon and containing hydrogen, on a desired substrate, forming a transparent conductive film on the photoconductor film by sputtering process, and heating the resulting structure in a temperature range between about 140° C. and about 280° C.

This heat treatment is effective to improve the photoresponse of the photosensor.

The above and other objects, features and advantages of the present invention will become apparent from the following description made, by way of example, on the preferred embodiments in conunction with the accompanying drawings, in which.

Figure 1A:
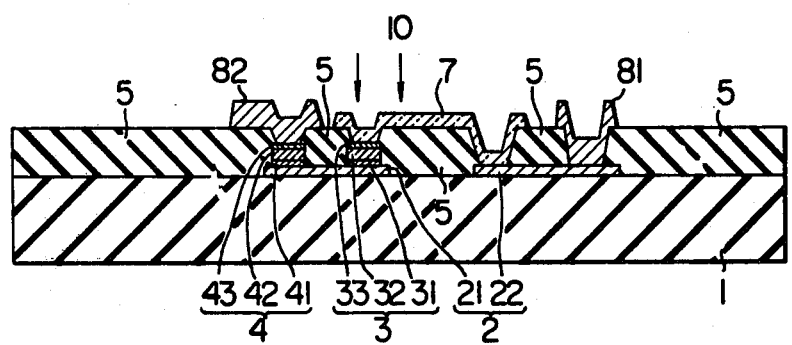
FIGS. 1a and 1b are a cross-sectional view and a plan view of a basic structure of a one-dimensional photosensor according to this invention.
Figure 1B:
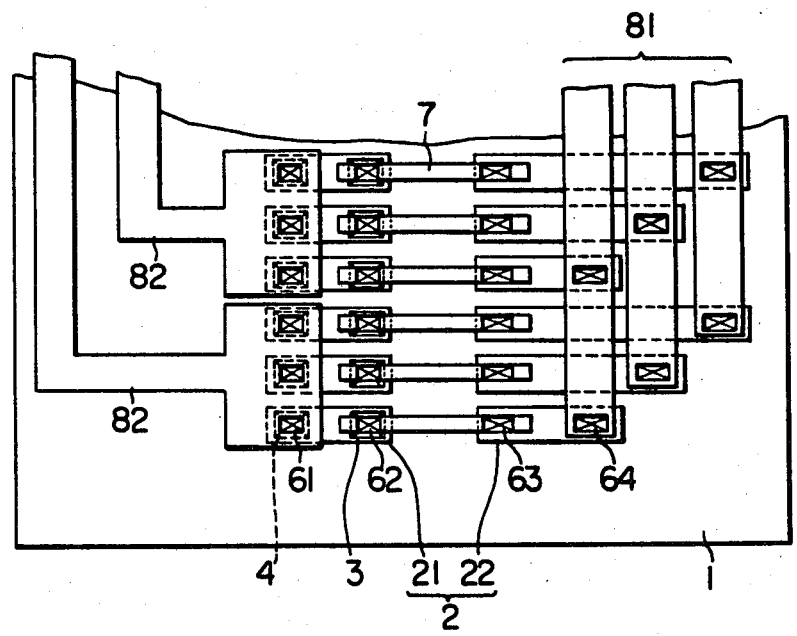

FIGS. 1a and 1b respectively show a cross-sectional view and a plan view of a linear image sensor.

Referring to FIG. 1a, an opaque metal electrode 2 (21 and 22) is formed on an insulating substrate 1, and on the electrode 2 are formed a hydrogenated amorphous silicon photodiode 3 and a hydrogenated amorphous silicon blocking diode 4. These diodes 3 and 4 are respectively formed of successive n+-conductivity type layers 31 and 41, i- or n-conductivity type layers 32 and 42, and p-conductivity type layers 33 and 43 in this order from the side of the metal electrode 21. The diode 3 is electrically connected to a transparent electrode 7 through a contact hole 62 bored at a desired position in an insulating layer 5 as shown in the plan view of FIG. 1b, and the transparent electrode 7 is also connected to the metal electrode 22 for double-layer wiring, through a contact hole 63. The metal electrode 22 is connected through a contact hole 64 to a metal wiring 81 and then to a row drive circuit. On the other hand, one end of the blocking diode 4 is connected to the diode 3 through the common electrode 21, and the other end thereof is connected through a contact hole 61 to a metal wiring 82 and then to a column drive circuit.

An example of operation of the photosensor shown in FIGS. 1a and 1b will be briefly described. Here, it is to be noted that the photodiode 3 and the blocking diode 4 are connected in series in opposed directions. First, a precharging bias (e.g. a positive voltage) is applied to the wiring 82. This bias voltage forms a precharge bias across the reversely biased photodiode 3 through the forwardly biased blocking diode 4. Thus, a predetermined voltage $V_T$ is stored across the photodiode 3. Then, the wiring 82 is returned to a resting (e.g. ground) potential. The interconnecting cathode electrode 21 for the two diodes is kept at the precharge potential $V_T$. Then, lights incident on the sensor are transmitted through the transparent electrode 7 and reach the photodiode 3. Lights absorbed in the photodiode excite electron-hole pairs. Electrons are attracted toward the positively biased cathode and cancel the stored charge. Namely, the stored charge varies with the amount of incident light. The decrease of the stored charge forms the signal charge. Here, the blocking diode is reversely biased and is isolated from the wiring 82. Then, the wiring 82 is again applied with the bias to forwardly bias the blocking diode 4 to charge the photodiode to the predetermined potential $V_T$. The signal charge can be read out as the charging current and the photosensor is reset. The above write (or store) and read operations are sequentially performed from each photo-diode by a pseudo-matrix drive which employs column-like and row-like drive ICs for selecting each pair of wirings 82 and 81, thus taking out a one-dimensional picture information. The one-dimensional image sensor of this structure has its entire picture elements divided into a plurality of groups, each group being scanned at a time, so that the scanning circuit can greatly be simplified. Moreover, since the photo-diode 3 and blocking diode 4 can simultaneously be formed by the same process, the number of the manufacturing processes for this structure is small.

When the one-dimensional photosensor as shown by the cross-sectional view of a picture element thereof in FIG. 1a is used as a one-dimentional image sensor for a facsmile unit, it is necessary that a transparent protective layer for prevention of wear be formed on the top of the transparent electrode and the other sensor surfaces because the copying paper is moved in intimate contact with the sensor. Alternatively, instead of the protective coating, a glass plate thin enough to maintain the required resolution may be bonded face to face to the sensor surface with an adhesive. Upon forming such protective layer, the transparent electrode 7 is often peeled off if the adhesion between the photo-diode structure 3 and the transparent electrode 7 is poor, or weak. From this point of view it is necessary to form the transparent electrode 7 by the sputtering process rather than the vacuum evaporation process.

There is known a method of forming indium oxide-tin oxide family transparent electrode from indium-tin family halide or organometallic salt by wthe CVD (Chemical Vapor Deposition) process. This method, however, needs to keep the subtrate temperature at 300° C. or above in order to form a film having a low specific resistance with negligible resistance change with time, and high adhesion to the underlying film. On the other hand, the photo-conductor film formed of hydrogenated amorphous silicon, when heated to 300° C. or above, is greatly reduced in sensitivity to lights in the visible range. Therefore, it has been difficult through the CVD process to form a transparent electrode for a photosensor using a hydrogenated amorphous silicon diode as a photo-conductor film.

The one-dimensional photosensor as shown in FIGS. 1a and 1b is operated such that after the light-signal charges are accumulated within the photo-diode 3 for a constant storage time (for example, 3 millisec.), they are read through the wiring 82 by forward-biasing the blocking diode 4 into the on-state for a very short time (for example, 500 nanosec. to 10 μsec.), which is called the storage mode hereinbelow.

Figure 2:
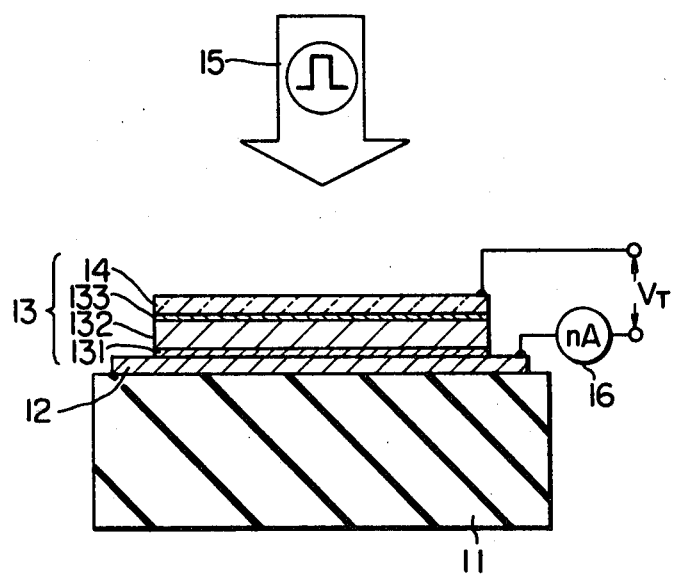
FIG. 2 is a cross-sectional view of a photosensor to be tested.
Figure 3:
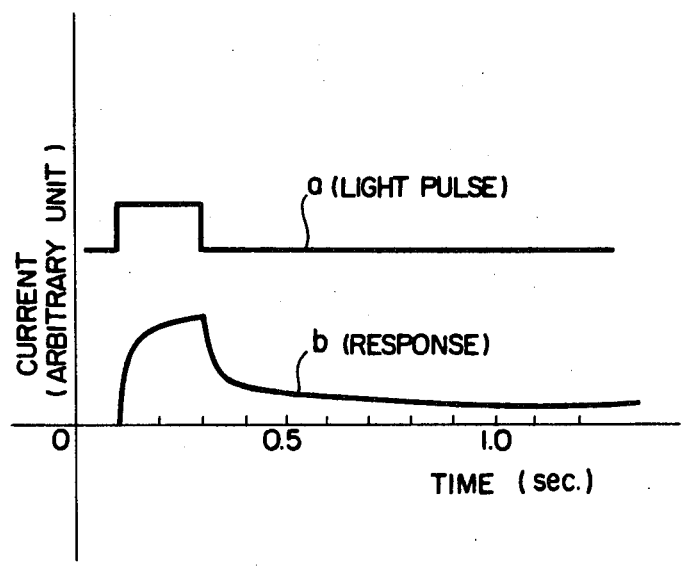
FIG. 3 is a graph of a photo-response characteristic of a photosensor on which a transparent electrode is formed by sputtering.

FIG. 2 shows a photosensor used for measuring the photo-response characteristic of the photo-diode. This photosensor is formed of a lower electrode 12 formed on a substrate 11, a photo-diode 13 made of hydrogenated amorphous silicon formed on the lower electrode, and a transparent electrode 14 formed on the photo-diode. The photoconductor film is always supplied with a constant reverse bias voltage $V_T$, and photoionized charges caused in the photo-diode 13 by a light pulse 15 can be measured directly on an ammeter (e.g. nanoampere meter) 16. The photo-diode is formed of an $n^+$-type hydrogenated amorphous silicon layer 131, an i- or n-type hydrogenated amorphous silicon layer 132, and a p-type hydrogenated amorphous silicon layer 133. FIG. 3 shows one axample of the photo-response characteristic of the photosensor having a transparent electrode formed by sputtering process as shown in FIG. 2. In FIG. 3, characteristic a represents an incident light pulse, and characteristic curve b shows a photoresponse characteristic of the photo-diode 13 reverse-biased, i.e. with its transparent electrode negatively biased (generally, bias voltage $V_T$ is selected to be about 0 to 10 V). From FIG. 3 it will be seen that the photosensitive characteristic with negative bias applied to the transparent electrode is very poor. In other words, FIG. 3 shows that when a light pulse is applied to the photo-diode with its transparent electrode applied with a negative voltage, negative charges are injected from the transparent electrode into the diode (secondary photo-current is caused) and as a result, decay current flows for a long time even after the light pulse disappears, with its value gradually decreasing but not reaching the dark current level in a short time. This may occur when charged hole traps cannot be easily annihilated. This phenomenon, for example in one-dimensional photosensor, causes the reproduced picture to be expanded or compressed in its pattern width in the sub-scanning direction (paper feeding direction). In an extreme case, no reproduced picture can be obtained. Moreover, since the time constant of the photo-response characteristic in which secondary photo-current is dominant is several tens of milliseconds or above, a high-speed facsimile is difficult to be realized with use of such photosensor. The secondary photo-current phenomenon severely affects the performance of the photosensor, e.g. one-dimensional image sensor, causing it not to be practically used.

According to an aspect of this invention, after an amorphous photo-conductor film made chiefly of silicon and containing hydrogen is formed on a substrate on which desired wiring has been built up, a transparent electrode is formed on the photo-conductor film by a sputting process. In this example, the amorphous photo-conductor film is formed of n+-type layer, i- or n-type layer and p-type layer in this order from the substrate side. Then, the one-dimensional photosensor is heated to a temperature from about 140° C. to about 280° C., more preferably in a temperature range from 170° C. to 250° C. Thereby, the reduction in the photo-response of the sensor which may be ascribed to the formation of the transparent electrode on the photo-conductor film by sputtering process, is improved. Thus, there can be provided a one-dimensional photosensor improved in its photo-response characteristic and having a high sensitivity, which is suited for high-speed facsimile use. Moreover, the reason why n+-type layer, i- or n-type layer, p-type layer and a transparent electrode are formed in this order to build up a photo-diode to be used, is as follows. The incident light is mostly absorbed in the vicinity of the transparent electrode, causing photo-carriers. Here, among the excited electron-hole pairs, electrons have superior transit characteristics to holes in the photoconductor layer. Thus, when the photo-diode is reverse-biased, it is advantageous to take such a construction that electrons are moved from the transparent electrode to the metal electrode.

The reactive sputtering process may be employed for forming the photo-conductor film. Sputtering can be achieved in a general sputtering apparatus or a high-speed sputtering apparatus of magnetron type. In the sputtering apparatus, a polycrystalline silicon is provided on one electrode, or a cathode (target electrode) of the opposed electrodes as a sputtering target, and a one-dimensional photosensor substrate having a desired wiring thereon is disposed on the other electrode, or anode (substrate-side electrode). The sputtering chamber is kept at a high vacuum of $1 \times 10^{-6}$ Torr or below and heated to 250° to 300° C. so as to degas (or outgas) the sputtering chamber. Then, as a discharge gas, a mixture of hydrogen, argon as a rare gas, and a small amount of doping gas is introduced into the sputtering chamber. RF (radio frequency) sputtering at 13.56 MHz is performed to deposit on the substrate an amorphous photo-conductor film formed chiefly of silicon which contains hydrogen, usually of 2 to 30 atomic percent (at %). During the formation of the film, the substrate temperature is 100° to 350° C., the discharge gas pressure at $8 \times 10^{-4}$ Torr to $2 \times 10^{-2}$ Torr, and the hydrogen gas in the discharge gas is in the range of 10 to 60 mol %. During formation of the photo-conductor films, a small amount, about 0.01% to 1% of nitrogen gas or a small amount, e.g. about 0.01 to about 5% of phosphorous hydride, for example phosphine (PH$_3$), is added in the mixture of argon and hydrogen as a doping gas to form the n+-type layer, and a small amount, e.g. about 0.01 to about 5% of boron hydride, for example diborane (B$_2$H$_6$), is added in the mixture of argon and hdyrogen to form the P-type layer. When such doping is not performed, the i- or n-type layer is generally formed. Thus, under the sputtering conditions as set forth above, the n+-type, i- or n-type and p-type layers are formed in this order as the photo-conductive films for the photo-diode and blocking diode.

The glow discharge CVD (chemical vapor deposition) process, on the other hand, is classified typically into two kinds of process: the RF coil process and the two-electrode discharge process. Both processes employ a mixture gas of silane gas such as SiH$_4$ as discharge gas and rare gas such as argon or hydrogen, making flow discharge therein so that an amorphous photo-conductor film made chiefly of silicon and containing hydrogen is deposited on the substrate for the one-dimensional photosensor by decomposition reaction of silane gas. This process is different from the reactive sputtering process utilizing the reaction of silicon with hydrogen. In the RF coil method, a reaction chamber is placed through the RF coil in which a high frequency current of 13.56 MHz is passed, so that glow discharge is caused in the gas mixture of SiH$_4$ and argon introduced in the chamber. Consequently, an amorphous photo-conductor film made chiefly of silicon and containing hydrogen is deposited on the substrate for the one-dimentional photosensor. The electrode discharge process utilizes a normal sputtering apparatus in which a high-frequency voltage of 13.56 MHz is applied between the opposed electrodes to cause glow discharge in the mixture gas of SiH$_4$ and argon or hydrogen introduced in the reaction chamber, depositing amorphous photo-conductor film made chiefly of silicon and containing hydrogen is deposited on the substrate for the one-dimensional photosensor. The substrate temperature during deposition of film is 100° to 300° C., the discharge gas pressure is selected to be a value in the range from $5 \times 10^{-2}$ Torr to 2 Torr which is higher than that in the reaction sputtering process, and the amount of the SiH$_4$ gas in the discharge gas is within the range from 5 to 40 mol %.

Of the photo-conductor films, the n+-type layer is formed from the mixture gas of the SiH$_4$ gas and argon or hydrogen, and a small amount, about 0.01 to about 5% of phosphorous hydride, for example, phosphine (PH$_3$) as a doping gas, and the p-type layer is formed from the mixture gas of the SiH$_4$ gas and argon or hydrogen, and a small amount, about 0.01 to about 5% of boron hydride, for example, diborane (B$_2$H$_6$) as a doping gas. If such doping gas is not added to the mixture gas, an n- or i-type layer, in general is formed. Thus, under the glow discharge CVD conditions, the n+-type layer, i- or n-type layer and p-type layer are deposited in this order as the photo-conductor films for the photo-diode and blocking diode. Moreover, a proper amount of carbon or germanium may be contained in this hydrogenated amorphous silicon. The amount of carbon or germanium to be added to Si is dependent on the purpose, and generally limited below around 10 to 30 at. % with which the silicon does not lose its role.

In this above process, a photoconductor film of this hydrogenated amorphous silicon is deposited on a predetermined substrate, and then formed into a certain pattern, completing an array of photo-diodes and blocking diodes.

After a desired pattern of an insulating layer is formed, a transparent electrode is deposited thereon by the sputtering process. This transparent electrode may be: (1) a transparent electrode formed chiefly of indium oxide, tin oxide or the mixture thereof; or (2) a semi-transparent metal electrode formed chiefly of gold, platinum, tantalum, molybdenum, aluminum chromium, nickel, or one of the combinations thereof.

In order to form a transparent electrode (1), generally an RF sputtering is performed in a rare gas such as argon using a target of indium oxide-tin oxide family sintered substance. There is also a method in which reactive RF sputtering is performed in the mixture or argon and oxygen with a target of indium-tin family metal. In the former case, the target of indium oxide-tin oxide family sintered substance is provided at one electrode or cathode (target-side electrode) of the opposed electrodes within the sputtering apparatus, and a substrate for a one-dimensional photosensor, having thereon films of hydrogenated amorphous silicon is mounted on the other electrode, or anode (substrate-side electrode). After the sputtering chamber is evacuated to a high vacuum of $5 \times 10^{-6}$ Torr or below, rare gas such as argon as a discharge gas is introduced into the sputtering chamber, in which high-frequency sputtering at 13.56 MHz is performed to cause an indium oxide-tin oxide transparent electrode of a predetermined pattern to be deposited on the photoconductor film. During film formation, the substrate temperature is 80° to 220° C. and discharge gas pressure is $3 \times 10^{-3}$ Torr to $5 \times 10^{-2}$ Torr. Thus, the transparent electrode is formed and then made to have a desired pattern, on which metal wiring for double layer wiring is formed, thus completing a one-dimensional photosensor of the shape as shown in FIG. 1.

As to the semi-transparent metal electrode (2), metal made chiefly of gold, platinum, tantalum, molybdenum, chromium, nickel, or one of the combinations thereof is mounted on the cathode (target-side electrode) within the sputtering apparatus, as a target electrode, and the same sputtering as in the transparent electrode (1) is performed to cause a transparent metal electrode to be deposited on the substrate. In this case, the semi-transparent metal electrode is made as thin as possible in order to have good transmission of light. Normally, the thickness of the electrode is 400 Å or below.

Figure 4:
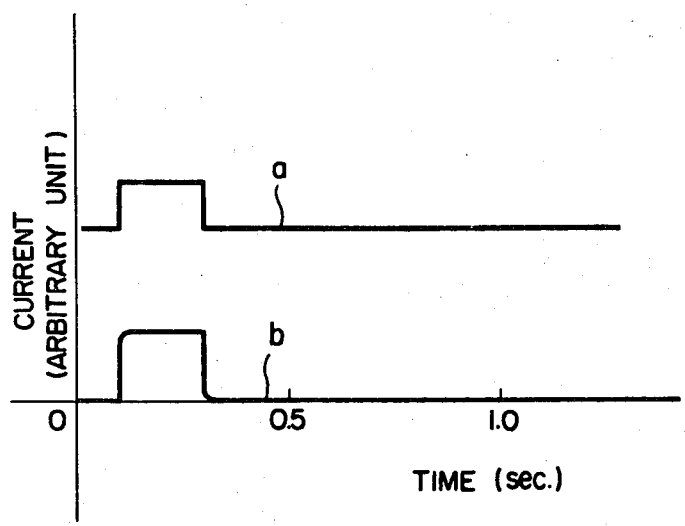
FIG. 4 is a graph of an improved photoresponse characteristic of the photosensor heat-treated according to an embodiment of this invention.

After the transparent conductive film is formed, this image sensor is heated at least about 140° C. and below about 280° C., preferably at a temperature between 170° C. and 250° C., for about 15 minutes to several hours, the response speed to light is improved to a satisfactory extent. FIG. 4 shows one example of the photo-response characteristic. Comparison between FIGS. 3 and 4 reveals that the response-to-light characteristic in FIG. 4 is improved to a great extent.

Figure 5:
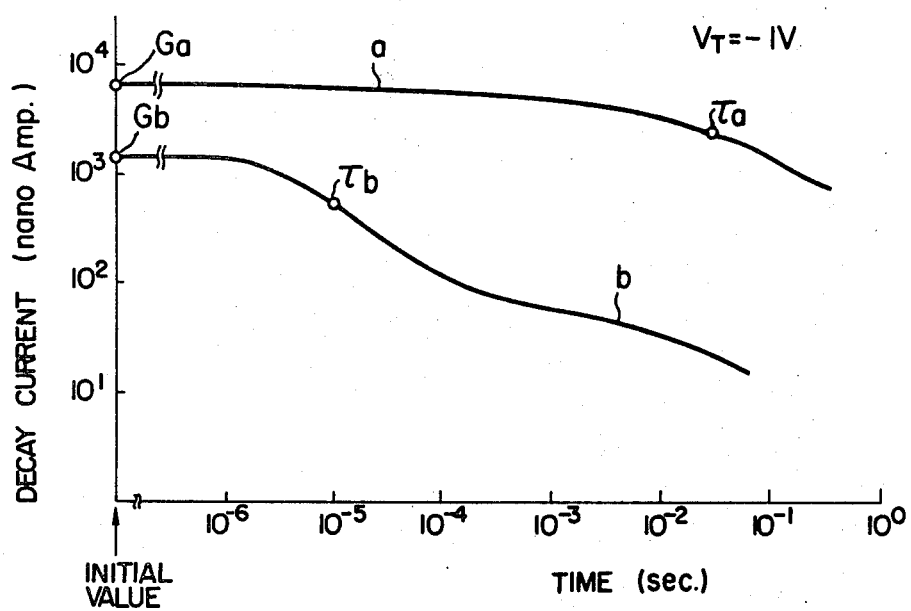
FIG. 5 is a graph of attenuation characteristics of photo-current after turning off light, for the photosensor heat-treated and for one without heat treatment.

FIG. 5 shows a graph of one example of the improvement in which the degree of the improvement is quantitatively examined with the decay current after light is shut off from being incident to the sensor. In FIG. 5, curve a shows the decay current before heat treatment, and curve b that after heat treatment. Before heat treatment, as shown by curve a, the initial value (photo-current just before turning-off of light) is large (photoelectric gain Ga=4), and the time constant of decay $\tau_a$ is as large as 30 millisec., which shows a photo-response characteristic in which the so-called secondary photocurrent is dominant. On the other hand, after heat treatment, the photoelectric gain Gb at the initial time is 1 since the secondary photocurrent is suppressed, and the time constant of decay $\tau_b$ is 10 $\mu$sec., or 1/3000 of the $\tau_a$ as shown by curve b. In addition, the time constant of the measuring circuit system is also included in the curve b and hence actual improvement will be larger.

Figure 6:
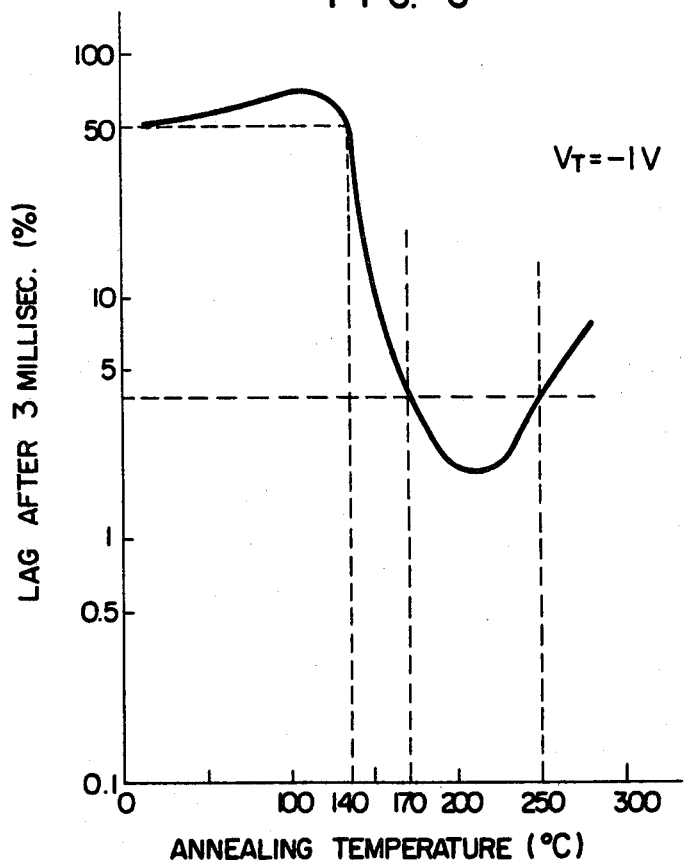
FIG. 6 is a graph of the relation between heat-treatment temperature and lag after 3 millisec. which shows the effect of heat treatment according to an embodiment of this invention.

In the one-dimensional photosensor of FIGS. 1a and 1b, the relation between the heat-treatment temperature and the lag (decay current/initial current) 3 millisec. after turning-off of light is shown in FIG. 6. In this case, the heat treatment time is 60 minutes. From FIG. 6 it will be seen that as the heat treatment temperature is gradually increased from the room temperature, the lag is first gradually increased to the maximum at a value between 100° to 120° C., thereafter at about 140° C. it is rapidly decreased, then at a value between 170° C. to 250° C. it reaches the minimum, and above those temperatures it increases. In the temperature range of about 140° C. to about 280° C., the annealing effect is apparent. More preferable results are obtained between 170° C. and 250° C. When the heat treatment is performed for 20 to 30 minutes at each temperature, the lag is saturated at that temperature. Thus, the heat treatment for too long time is of no value. Although the heat treatment is usually performed in air, it was also confirmed that the heat treatment can be performed in rare gas such as argon gas or inert gas such as nitrogen gas with the same effect. In general, one-dimensional photosensors with lag value of 4% or below after 3 millisec. can be used satisfactorily. As is apparent from FIG. 6, the one-dimensional sensor of FIGS. 1a and 1b heat-treated at least at about 140° C. and not greater than about 280° C. comes to have an effect for practical use, and the sensor heat-treated at a temperature of 170° C. to 250° C. has lag value of 4% or below after 3 millisec. and thus is very satisfactory.

The effect of this invention as shown in FIGS. 5 and 6 is for solving the problem caused between a photodiode and a transparent electrode by depositing (by sputtering) the transparent electrode on the photodiode formed of photo-conductors of hydrogenated amorphous silicon. This method is completely different from the technique that the hydrogenated amorphous silicon is deposited by the reactive sputtering or glow discharge process and heat-treated, without the transparent electrode overlie, at 220° to 270° C. in vacuum within the photo-conductive film depositing apparatus for the purpose of greatly improving the sensitivity to light.

It will be apparent that the method of this invention can be applied not only to the one-dimensional photosensor, but also to general photosensitive elements having the structure in which in principle a transparent electrode is formed on the hydrogenated amorphous silicon film by sputtering technique. For example, this invention is useful for solar batteries or solid-state image sensors formed of a photoconductor film or films.

Figure 7:
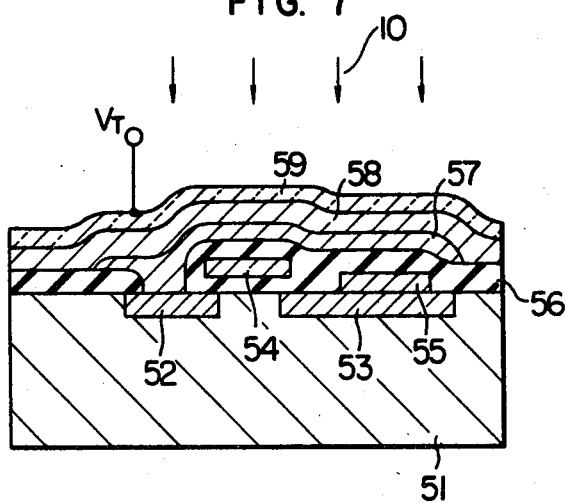
FIG. 7 is a cross-sectional view of another basic structure of a solid-state image sensor.

Another example of a solid-state image sensor will be described hereinbelow. As shown in FIG. 7, a scanning circuit, a switching circuit and so on are integrated on a Si-substrate 51 and a photo-conductor film 58 for photoelectric conversion is deposited over the Si-IC substrate. The basic operation will be described below. The incident light 10 is passed through a transparent electrode 59 and then reaches the photoconductive film 58, where the light is absorbed to cause electron-hole pairs. The carriers are stored on a metal electrode 57 and a source region 52 described below, by the application of bias voltage $V_T$ to the transparent electrode 59, and then taken out through a signal line 55 by the switching operation of an insulated-gate field effect transistor (MOSFET) having a source 52, drain 53 and gate 54 formed at the surface of a semiconductor substrate 51. Reference numeral 56 represents an insulating film. This structure has a scannign circuit and a photoelectric converting portion which are isolated from each other, and hence it not only has high resolution and sensitivity to light but hardly causes blooming because light cannot reach the Si-substrate.

However, if a photo-conductive film of hydrogenated amorphous silicon is formed on the Si-IC substrate for scanning and then a transparent electrode of indium oxide-tin oxide system or a semi-transparent electrode of platinum is deposited thereon by sputtering process, the response-to-light characteristic of the photoconductive film is found to be deteriorated.

When used as a color solid-state image sensor, the solid-state image sensor of which a picture element is shown in cross-section in FIG. 7, needs on the top of the transparent electrode the formation of a color filter layer for selectively permitting transmission of light of a predetermined range of wavelength. If, in the process of forming this color filter layer, the adhesion between the photo-conductive film 58 and transparent electrode 59 is weak, the transparent electrode 59 will often be peeled off. From this point of view, it is necessary to form the transparent electrode 59 by sputtering rather than by vacuum evaporation process.

The solid-state image sensor as shown in FIG. 7 is of the type in which light-signal charges are stored for a constant accumulation time (for example, 1/30 sec.), and then read out through the signal line 55 in a very short time by the built-in MOSFET switch (the storage mode).

Figure 8:
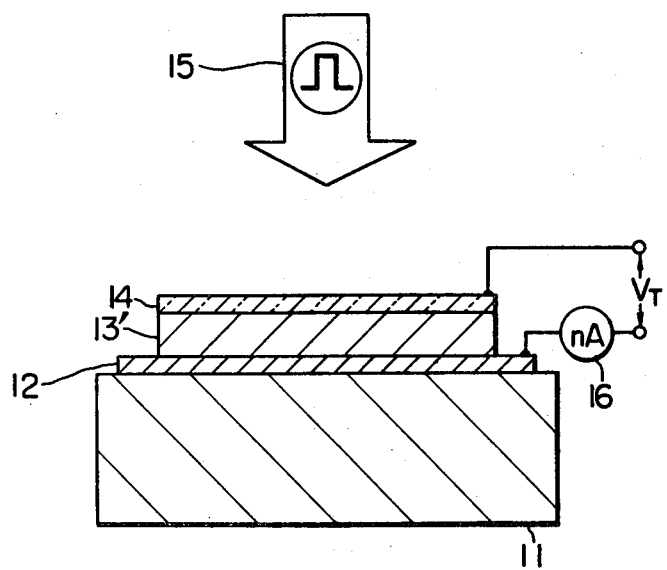
FIG. 8 is a cross-sectional view of a photosensor to be tested.
Figure 9:
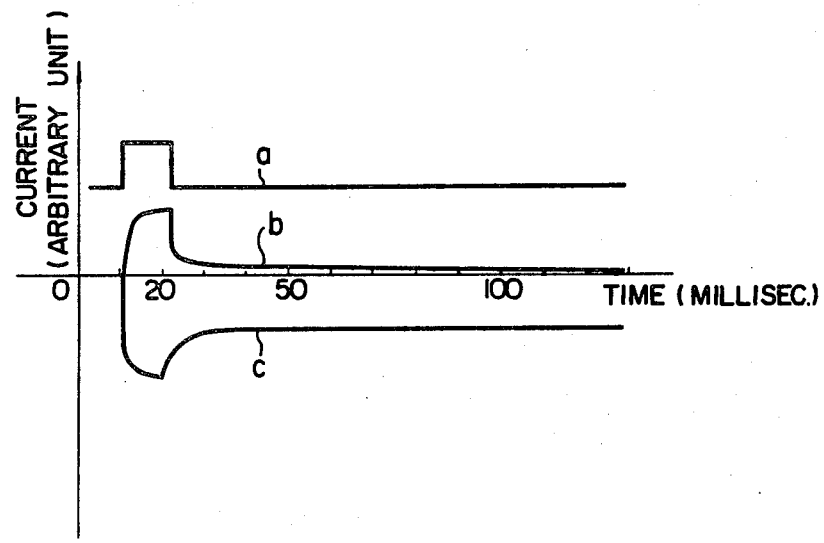
FIG. 9 is a graph of a photo-response characteristic of a photosensor the transparent electrode of which is formed by sputtering.

FIG. 8 shows a photosensitive element used for testing the response-to-light characteristic of a photoconductive layer. This element is formed of the lower electrode 12, the photo-conductive film 13' of hydrogenated amorphous silicon and the transparent electrode 14, successively provided on the substrate 11. A constant voltage $V_T$ is always applied to the photoconductive film, and the charges excited on the photoconductive layer 13' by the light pulse 15 can be read directly by the ammeter (e.g. nanoampere meter) 16. FIG. 9 shows one example of the photo-response characteristic of a photo-sensitive element having a hydrogenated amorphous silicon layer on which a transparent electrode is formed by sputtering. In FIG. 9, characteristic a indicates the incident light pulse, and curves b and c the photo-response characteristics for the cases where the transparent electrode is biased with a positive voltage (generally, $V_T$ is within a range from 0 to 21 V) and a negative voltage (generally, $V_T$ is within a range from 0 to −21 V), respectively. From FIG. 9, it will be seen that particularly, the characteristic for the case where a negative voltage is applied to the transparent electrode is very poor. In other words, FIG. 9 shows that when a light pulse is incident on the photo-sensitive element with the transparent electrode negatively biased, negative charges are injected into the element from the transparent electrode (as it is called the secondary photo-current) and thus large decay current continues to flow for a longer time even after the light pulse is stopped, with the dark current level being not reached. This phenomenon results in lag or after image which remains for a long time after light is stopped, and this lag or after image is greatly disadvantageous to the solid-state image sensor.

According to this embodiment, the transparent electrode is deposited on the photo-conductive film by sputtering process, and then this solid-state image sensor is heat-treated at a temperature within a range of about 140° C. to about 280° C. and more preferably within a range from 170° C. to 250° C., thereby improving the response-to-light characteristic. Therefore, the solid-state image sensor according to this embodiment has a high resolution and a high spectral sensitivity to visible light range, while very little blooming phenomenon is seen to occur.

Figure 10:
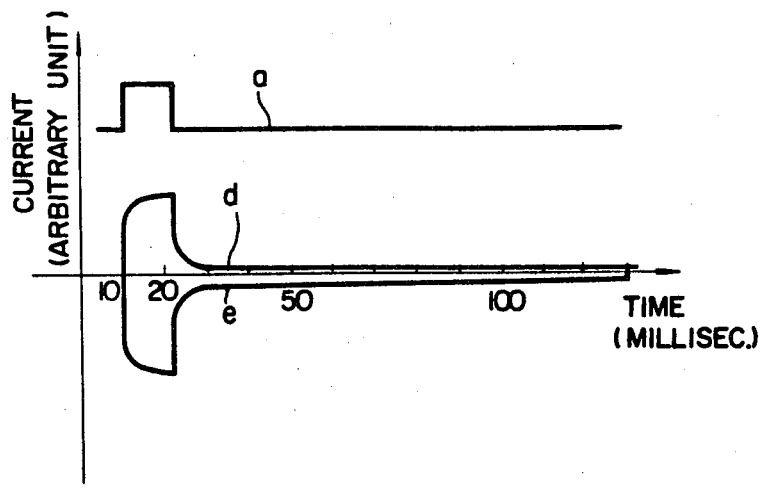
FIG. 10 is a graph of an improved photoresponse characteristic of the photosensor of FIG. 9, heat-treated according to an embodiment of this invention.

FIG. 10 shows an example of the photo-response characteristic of the image sensor according to this embodiment. In FIG. 10, characteristic a shows an incident light pulse, and curves d and e the photo-response characteristics for the cases where the transparent electrode is biased positively and negatively (in general, $V_T$ is 0 to ±21 V), respectively. From FIG. 10, it will be seen that the photo-response characteristic particularly for the case where negative bias is applied to the transparent electrode is greatly improved as compared with that in FIG. 9. In other words, the secondary photocurrent is suppressed which is caused by injection of negative charges from the transparent electrode, and the decay current after light is turned off is reduced to the dark current level in a short time. Moreover, in the cases where negative and positive biases $V_T$ of relatively low voltages are respectively applied to the transparent electrode, the sensitivity to light is improved as compared with those before heat treatment.

Figure 11:
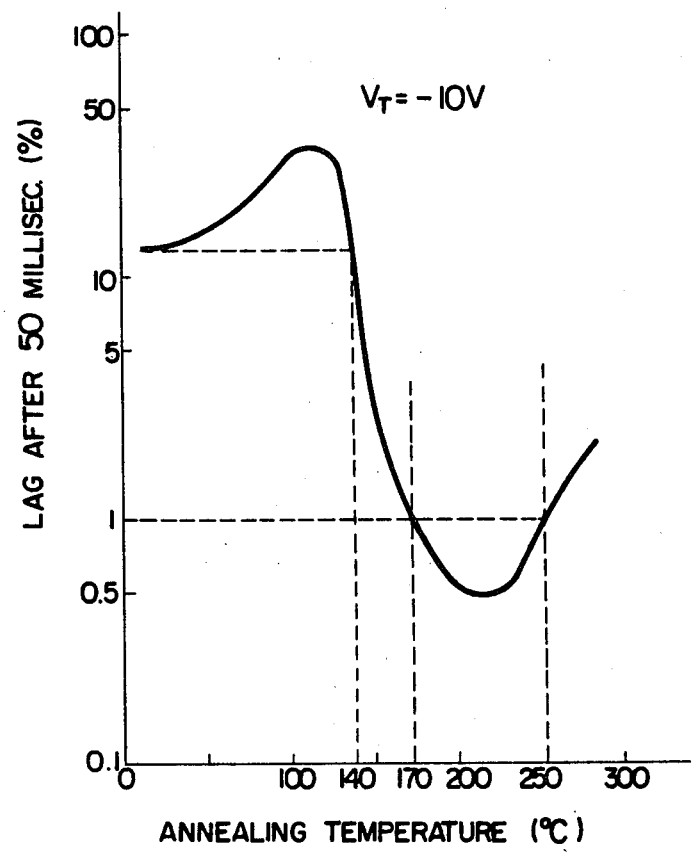
FIG. 11 is a graph of the relation between the heat-treatment temperature and the lag after 50 millisec., which shows the effect of the heat treatment according to an embodiment of this invention.

FIG. 11 is a graph showing the relation between the temperature for heat treatment and the lag value 50 millisec. after turning-off of light in the solid-state image sensor. In this case, the heat treatment is performed for 20 minutes. As is evident from FIG. 11, the lag value gradually increases with increase of heat treatment temperature starting from the room temperature, and reaches the maximum at a temperature between 100° to 120° C. Then, it decreases rapidly around 140° C. and reaches the minimum at a temperature between 170° C. and 250° C., thereafter increases again. The annealing effect is apparent in a temperature range between about 140° C. and about 280° C. The time for heat treatment is 20 to 40 minutes at each temperature, in which the lag value is saturated at that time. Therefore, unnecessarily long heat treatment is useless. Although the heat treatment is usually performed in air, it was found that it can be made in rare gas such as argon gas or inert gas such as nitrogen with the same effect. Requirement for the general image sensing device which can be used practically is satisfied by 1% or less lag after 50 millisec. From FIG. 11, it will be seen that the solid-state image sensor will have 1% or less lag after 50 millisec., under heat-treatment of 170° C. to 250° C.

Embodiment 1

Figure 12:
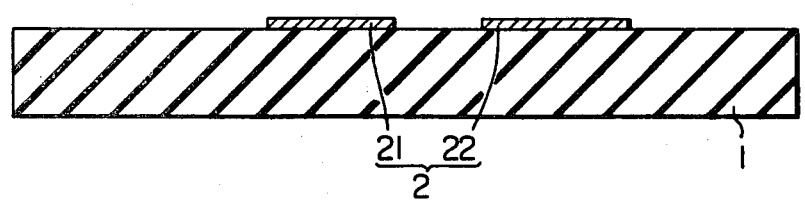
FIGS. 12 to 16 are cross-sectional views of a main part of a one-dimensional photosensor according to an embodiment of this invention, which show the manufacturing processes for making a sensor.
Figure 13:
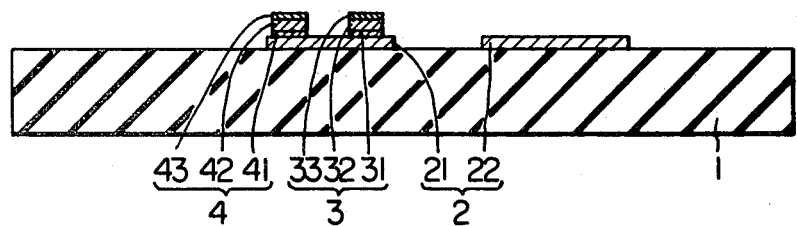
Figure 14:
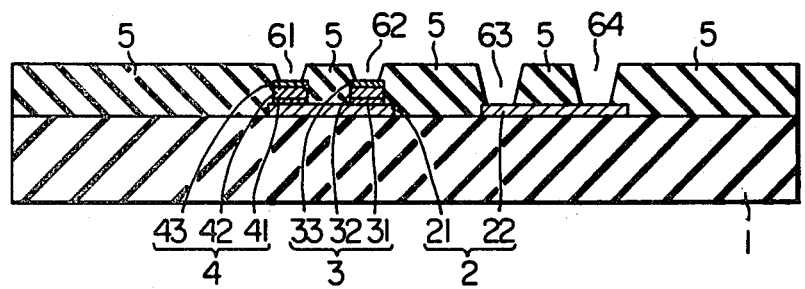
Figure 15:
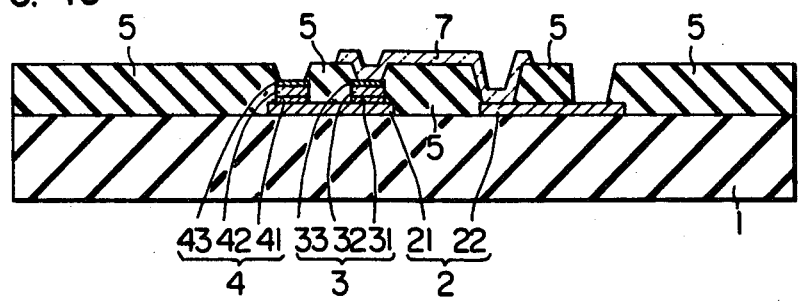
Figure 16:
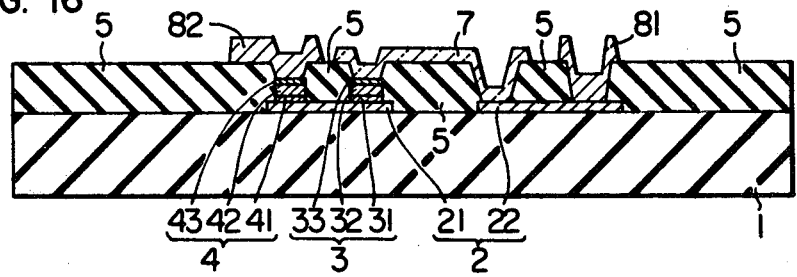

FIGS. 12 to 16 are cross-sectional views of a picture element portion at successive processes for producing a one-dimensional photosensor, Metal chromium is deposited on the insulating substrate 1 to about 2000 Å thickness by sputtering. The chromium film on the substrate 1 is selectively photo-etched away by cericammonium-nitrate etchant into the desired electrode pattern 2 (21 and 22) as shown in FIG. 12, where 21 represents the electrode for a photo-diode and a blocking diode, 22 the lower electrode for double layer wiring. Then, this substrate is mounted in a two-electrode type glow-discharge CVD apparatus, and discharge gas, e.g. $H_2$ gas of 1 Torr containing 10% $SiH_4$ and doping gas, $PH_3$ gas at 1% volume ratio ($PH_3/SiH_4$) are introduced into the reaction chamber, in which high-frequency discharge at 13.56 MHz is performed to form a n+-type layer made chiefly of hydrogenated amorphous silicon on the substrate to about 250 Å thickness. Subsequently, the $PH_3$ gas is stopped from being fed to the reaction chamber, and the high-frequency discharge is continued in the mixture gas of 10% $SiH_4$ +90% $H_2$ only, so that an i-type layer made chiefly of hydrogenated amorphous silicon is deposited on the substrate to 5500 Å thickness. Then, $B_2H_6$ gas as a doping gas is introduced at a volume ratio ($B_2H_6/SiH_4$) of 1% in addition to the discharge gas, and the high-frequency discharge is continued to form a p-type layer made chiefly of hydrogenated amorphous silicon on the substrate to 400 Å thickness. The n+-i-p-structure hydrogenated amorphous silicon film thus formed is patterned into a predetermined shape by the plasma etching process using $CH_4$ gas, thus the photo-diode 3 and blocking diode 4 being produced as shown in FIG. 13, where 31 and 41 represent the n+-type layers, 32 and 42 where the i-type layers, and 33 and 43 the p-type layers. Next, glass of $SiO_2$ system (trade name Corning 7059 available from Corning Co., USA) is deposited on the substrate by sputtering to a thickness of 2 μm and contact holes 61, 62, 63 and 64 are formed in the glass film at predetermined positions by $HF-HNO_3-H_2O$ etchant, thus, completing the insulating film 5 for two-layer wiring as shown in FIG. 14. Then, a transparent electrode of $In_2O_3-SnO_2$ system is deposited over the insulating film 5 to 5000 Å thickness by sputtering method. At this time, the target for sputtering is $In_2O_3$ sintered substance containing 5 mol% of $SnO_2$ attached to the cathode, and the discharge gas used is argon gas of $1 \times 10^{-2}$ Torr in which high-frequency sputtering is made at 13.56 MHz. After the transparent electrode is formed, the transparent electrode is patterned into a predetermined shape 7 by photoetching process using $HCl-HNO_3-H_2O$ etchant, thus an element of the cross-section as shown in FIG. 15 is produced. Thereafter, this element is heated in air at 225° C. for 60 minutes, so as to be improved in its response-to-light characteristic as shown in FIG. 4. Then, after this patterned ITO film is completely covered by a protective film of photoresist, Al film of 2 μm thickness is deposited on the substrate by vacuum evaporation process, and Al electrode patterns 81, and 82 for double layer wiring are formed by the photoetching process using $H_3PO_4-NH_3-H_2O$ etchant. At this time, the ITO film is covered by the photoresist and thus is prevented from dissolving by the etchant to Al. After the formation of Al electrode pattern, the protective film on the ITO film is removed by oxygen plasma-asher process, thus a one-dimensional photosensor capable of high-speed reading being produced as shown in FIG. 16.

EMBODIMENT 2

The method of this invention is also useful for producing solar batteries. In this case, in addition to the improvement in the response-to-light characteristic, the voltage-current characteristic of the hydrogenated amorphous silicon photo-diode upon reception of light is improved.

Figure 17:
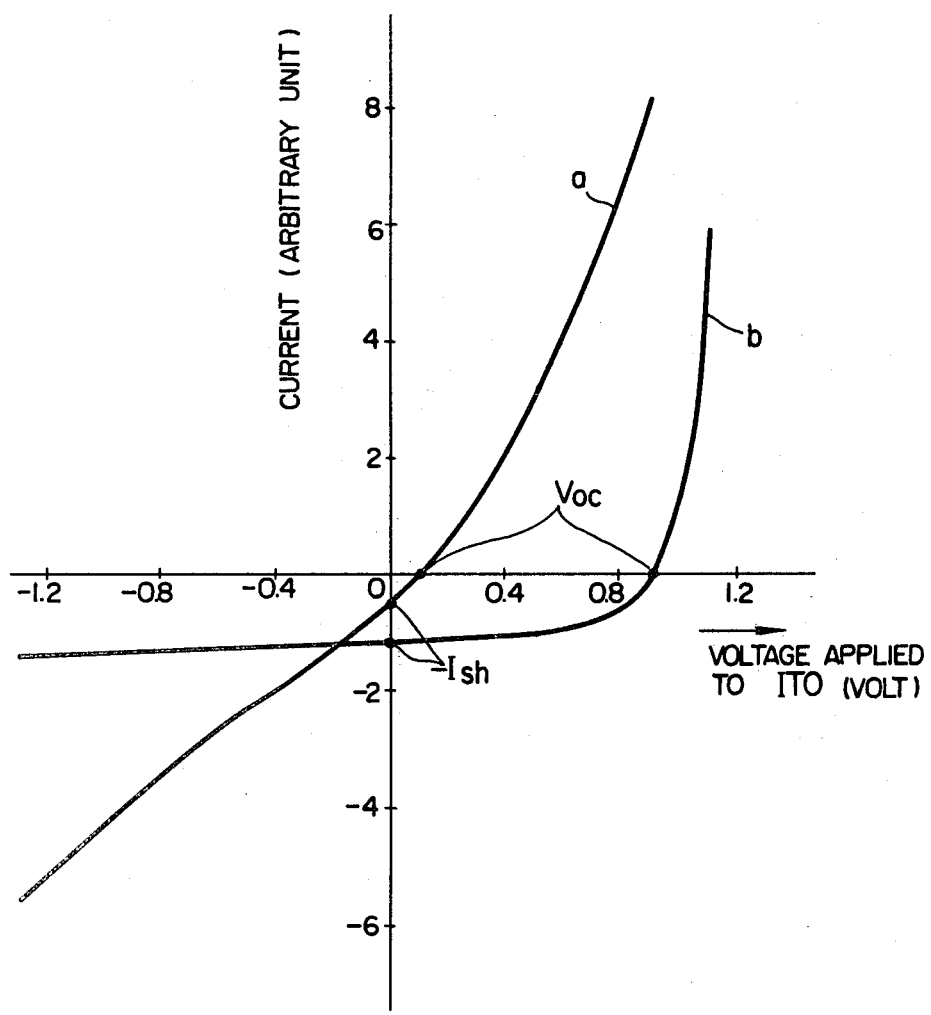
FIG. 17 is a graph of an improved characteristic of a solar cell which is provided according to an embodiment of this invention.

Layers of n+-type and i-type conductivity are formed on a desired stainless-steel substrate by the same process as in Embodiment 1. High-frequency discharge is continued in the gas mixture of 10% $SiH_4$ + 90% $H_2$, added with doping gas of $CH_4$ gas of 3% volume ratio ($CH_4/SiH_4$) and $B_2H_6$ gas of 1% volume ratio ($B_2H_6/SiH_4$) to form a p-type layer of 350 Å thickness made chiefly of amorphous silicon carbide and containing hydrogen (a-SiC:H). Then, a transparent electrode of $In_2O_3-SnO_2$ is deposited on the conductive layer to 1000 Å thickness by sputtering at the same conditions as in the Embodiment 1. Thus, a solar battery of a cross-section as shown in FIG. 2 is produced, which has poor characteristics exhibiting almost no photodiode characteristic. For example, as shown in FIG. 17 by curve a, the open circuit voltage, $V_{OC}$ and short circuit current $I_{sh}$ upon reception of light are small. Then, when this device is heated in air at 230° C. for 20 minutes, the voltage-current characteristic is remarkably improved as shown in FIG. 17 by curve b.

EMBODIMENT 3

The method of this invention can also be applied to the solar battery of n-i-p multi-layer hereto junction. First, on the stainless steel substrate are formed an n+-type layer (200 Å) of hydrogenated amorphous silicon, an i-type layer (4000 Å) made chiefly of amorphous silicon-germanium and containing hydrogen (a-$Si_{0.80}Ge_{0.20}$:H), and a p-type layer (250 Å) of hydrogenated amorphous silicon. Then, a photo-diode of n+-i-p structure (the film thickness of i-layer being 800 Å) made of hydrogenated amorphous silicon is formed on the p-type layer by the same process as in Embodiment 1. Thereafter, a transparent electrode is formed thereon, and the element thus formed is subjected to heat treatment by the same process as in the above embodiments, so that a solar battery of good performance can be produced.

EMBODIMENT 4

Figure 18:
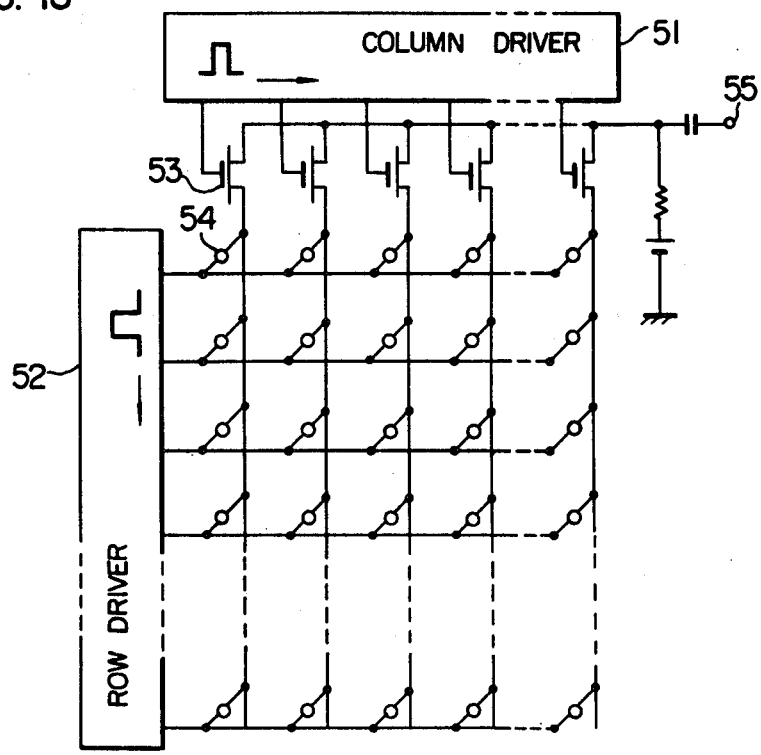
FIG. 18 is a basic circuit diagram of a solid-state image sensor.
Figure 23:
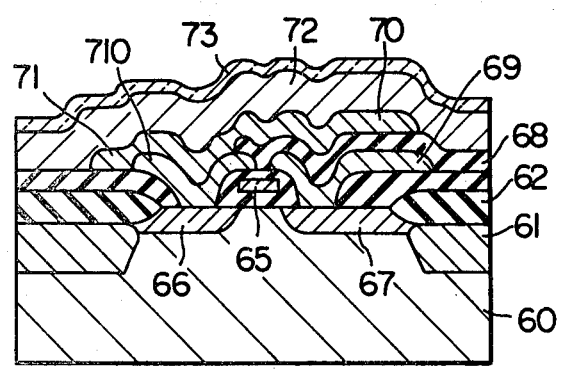

FIG. 18 shows a fundamental circuit diagram of a solid-state image sensor. Picture elements 54 are arranged in a matrix form, and read according to the XY address system. The selection of each picture element is performed by a horizontal scanning signal generator 51 and a vertical scanning signal generator 52. Reference numeral 53 represents switch portions (FETs) connected to the picture elements, and 55 an output end. Each picture element 54 includes a MOSFET and a photoconductive layer deposited thereon. A typical example of the structure is as shown in FIG. 23.

Figure 19:
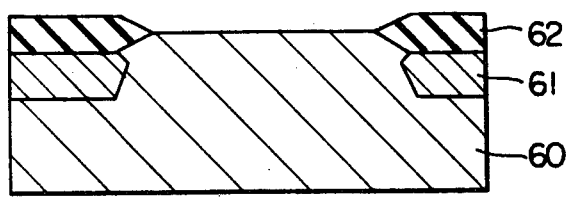
FIGS. 19 to 23 are cross-sectional views of main part of a solid-state image sensor, which show the manufacturing processes for making the sensor.
Figure 20:
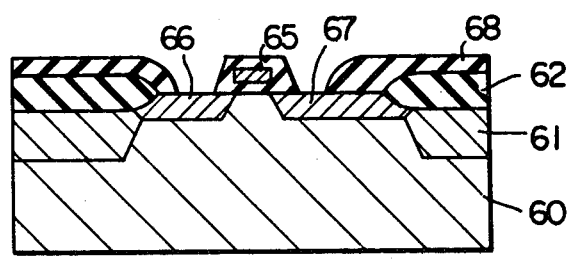
Figure 21:
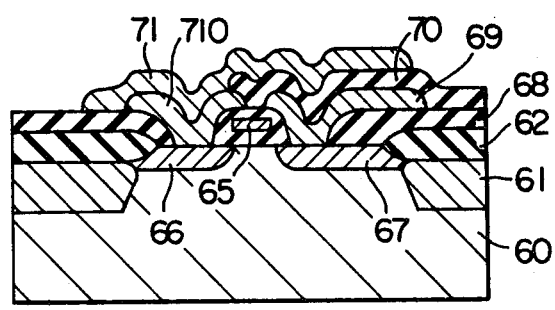

FIGS. 19 to 23 are cross-sectional views of a picture element of a solid-state image sensor, which show the manufacturing processes for the image sensor. The switch circuits, scanning circuit portions and so on are formed in the semiconductor substrate by the normal processes for semiconductor devices. An $SiO_2$ film as thin as 800 Å is formed on a p-type silicon substrate 60, and an $Si_3N_4$ film of about 1400 Å thickness is formed on the $SiO_2$ film at a predetermined position. The $SiO_2$ film is formed by the conventional CVD process and $Si_3N_4$ film by a CVD process using $SiH_4$, $NH_4$ and $H_2$. Then, a p-type diffused region 61 is formed in the top portion of the silicon substrate by ion-implantation process, in order to more accurately isolate the elements. Thereafter, silicon is locally oxidized in the atmosphere of $H_2$: $O_2$ = 1: 8 to form a $SiO_2$ film 62 as shown in FIG. 19. This process is a local oxidizing of silicon for isolation of elements, generally called the LOCOS. The $Si_3N_4$ film and the $SiO_2$ film as mentioned above are removed, and gate insulating $SiO_2$ film is formed for MOS transistor. Then, polysilicon gate 65 and n-type diffused regions 66 and 67 are formed, and an $SiO_2$ film 68 is formed thereon. In the film 68 are formed bores for connecting source 66 and drain 67 to the outside, by etching process as shown in FIG. 20. Aluminum Al is evaporated to 6000 Å thickness to form drain electrode 69 and source electrode 710. A $SiO_2$ film 70 of 7500 Å thickness is deposited and then aluminum Al is evaporated at 2500 Å thickness to form a source electrode 71, as shown in FIG. 21. The electrode 71 is so formed as to cover the regions 66 and 67 because light incident to the signal processing region between the isolation diffusion 61 will cause blooming, and this blooming must be prevented.

Figure 22:
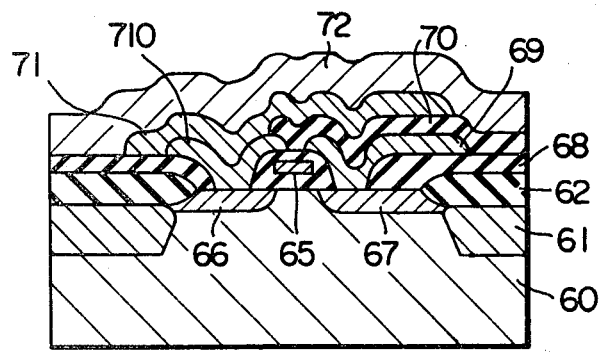

On the semiconductor IC substrate thus prepared, there is deposited the amorphous photo-conductor film 72 made chiefly of silicon and containing hydrogen to a film thickness of 3 μm by the reactive sputtering. At this time, a polycrystalline silicon is provided at the cathode as a target for sputtering. In the discharge gas, the mixture of hydrogen and argon (H$_2$:Ar=20:80) at pressure of $3\times10^{-3}$ Torr, is performed high-frequency sputtering of 13.56 MHz. The resulting amorphous silicon layer is of high resistivity and may not be divided for each picture element. The element after formation of photoconductive film is as shown in FIG. 22. Here, the photoconductive film is continuous over the picture element matrix. A transparent electrode 73 of In$_2$O$_3$-SnO$_2$ system is deposited over the photo-conductive film to 1000 Å thickness by sputtering. In this case, the target for sputtering used is an In$_2$O$_3$ sintered substance containing 5 mol% SnO$_2$, provided at the cathode, and the discharge gas is Ar gas at pressure of $8\times10^{-3}$ Torr at which high frequency sputtering of 13.56 MHz is performed. After the formation of a transparent electrode, an amorphous solid-state image sensor is formed as shown in FIG. 23. The lag of the sensor thus formed is as large as 10% or above. Then, when this sensor is heated in air at 240° C. for 20 minutes, lag can be reduced to 1% or below and no after image occurs. A second electrode is generally formed on the rear surface of the semiconductor substrate 60 and is generally grounded. A color filter layer having a predetermined spectral transmission characteristic is formed on the respective picture element electrodes of this sensor, to form a single-chip color noncrystalline solid-state image sensor, in which no peeling-off phenomenon is caused at the bonded interface between the photo-conductive film and the transparent electrode.

EMBODIMENT 5

A switch circuit, scanning circuit and so on are formed in a predetermined semiconductor substrate similarly as in Embodiment 4, as shown by the cross-section of the substrate in FIG. 21. The metal electrode 71 is a Ta electrode of 3000 Å thickness formed by sputtering.

On the semiconductor IC substrate thus prepared, is deposited the amorphous photo-conductive film 72 made chiefly of silicon and containing hydrogen to a film thickness of 3 μm by the glow discharge CVD process. In this case, mixture gas (SiH$_4$, 10 mol%+Ar, 90 mol%) is used as discharge gas, and at the gas pressure of $6\times10^{-2}$ Torr, high-frequency discharge of 13.56 MHz is caused between the opposite electrodes. Thus, the reaction of decomposing SiH$_4$ gas is made to form a layer of amorphous silicon containing hydrogen on the IC substrate which is mounted at the cathode and heated at 250° C. The sensor after formation of photoconductive film is similar as shown in FIG. 22. On the photo-conductive film is deposited a semi-transparent electrode of Pt to 200 Å thickness by sputtering process. In this case, a plate of Pt is mounted on the cathode, and high-frequency sputtering at 13.56 MHz is performed in Ar gas at a pressure of $5\times10^{-3}$ Torr, thus a solid-state image sensor is produced as shown in FIG. 23. The lag of the sensor is as large as 15% or above and after image is large. Then, when this sensor is heated in air at 225° C. for 30 minutes, the lag is reduced to about 0.5% under which no after image is caused.

What is claimed is:

1. A method of manufacturing a photosensor comprising the steps of:
   forming a photoconductor film of amorphous material made chiefly of silicon and containing hydrogen on a substrate;
   forming a transparent conductive film capable of transmitting light and of conducting electricity on said photoconductor film by sputtering, and
   heating said photosensor with said transparent conductive film in a temperature range of from at least about 140° C. to not greater than about 280° C.

2. A method of manufacturing a photosensor according to claim 1, wherein said heating step is performed at a temperature between 170° C. and 250° C.

3. A method of manufacturing a photosensor according to claim 1 or 2, wherein said step of forming a photoconductor film includes forming an n$^+$-type layer, forming an i- or n-type layer, and forming a p-type layer successively achieved in this order.

4. A method of manufacturing a photosensor according to claim 3, further comprising the step of forming a plurality of opaque metal electrodes on an insulating substrate to form a one-dimensional array electrode, thereby providing said substrate on which the photoconductor film is formed.

5. A method of manufacturing a photosensor according to claim 1 or 2, further comprising the step of forming switches arranged in a two-dimensional array in a semiconductor substrate to provide said substrate on which the photoconductor film is formed, each of said switches having a terminal exposed on a surface of the semiconductor substrate.

6. A method of manufacturing a photosensor according to claim 1 or 2, wherein said step of forming a transparent conductive film includes sputtering a transparent conductive film having a main component selected from the group consisting of indium oxide, tin oxide and a mixture thereof on said photoconductor film.

7. A method of manufacturing a photosensor according to claim 1 or 2, wherein said step of forming a transparent conductive film includes sputtering a semi-transparent metal film having a main component selected from the group consisting of gold, platinum, tantalum, molybdenum, aluminum, chromium, nickel and combinations thereof.

8. A method of manufacturing a photosensor according to claim 1, wherein said heating step is carried out for a period of at least about 15 minutes.

9. A method of manufacturing a photosensor according to claim 1, wherein said heating step is carried out in air.

10. A method of manufacturing a photosensor according to claim 1, wherein said heating step is carried out in an atmosphere formed of at least one gas selected from the group consisting of a rare gas and an inert gas.

11. A method of manufacturing a photosensor according to claim 1, wherein said photoconductor film contains from 2 to 30 atomic percent of hydrogen.

12. A method of manufacturing a photosensor comprising the steps of:
   forming a photoconductor film of amorphous material made chiefly of silicon and containing hydrogen on a substrate;
   forming a transparent conductive film on said photoconductor film by sputtering a transparent conductive oxide film having a main component selected from the group consisting of indium oxide, tin oxide and a mixture thereof on said photoconductor film; and heating said photosensor with said transparent conductive film to a temperature of at least about 140° C. and not greater than about 280° C.

13. A method of manufacturing a photosensor according to claim 12, wherein said heating step is performed at a temperature between 170° C. and 250° C.

14. A method of manufacturing a photosensor according to claim 12, wherein said step of forming a photoconductor film includes forming an n+-type layer, forming an i- or n-type layer, and forming a p-type layer, successively.

15. A method of manufacturing a photosensor according to claim 13, wherein said step of forming a photoconductor film includes forming an n+-type layer, forming an i- or n-type layer, and forming a p-type layer, successively.

16. A method of manufacturing a photosensor according to claim 13, further comprising the step of forming a plurality of opaque metal electrodes on an insulating substrate to form a one-dimensional array electrode, thereby providing said substrate on which said photoconductor film and said transparent electrode are then formed.

17. A method of manufacturing a photosensor according to claim 12, further comprising the step of forming switches arranged in a two-dimensional array in a semiconductor substrate to form said substrate on which said photoconductor film is formed, each of said switches having a terminal exposed on a surface of the semiconductor substrate.

18. A method of manufacturing a photosensor according to claim 13, further comprising the step of forming switches arranged in a two-dimensional array in a semiconductor substrate to form said substrate on which said photoconductor film is formed, each of said switches having a terminal exposed on a surface of the semiconductor substrate.

19. A method of manufacturing a photosensor comprising the steps of:

forming a photoconductor film of amorphous material made chiefly of silicon and containing hydrogen on a substrate;

forming a transparent conductive film on said photoconductor film by sputtering a semi-transparent metal film having a main component selected from the group consisting of gold, platinum, tantalum, molybdenum, aluminum, chromium, nickel and combinations thereof; and heating said photosensor with said transparent conductive film to a temperature of at least about 140° C. and not greater than about 280° C.

20. A method of manufacturing a photosensor according to claim 19, wherein said heating step is performed at a temperature between 170° C. and 250° C.

21. A method of manufacturing a photosensor according to claim 19, wherein said step of forming a photoconductor film includes forming an n+-type layer, forming an i- or n-type layer, and forming a p-type layer, successively.

22. A method of manufacturing a photosensor according to claim 21, further comprising the step of forming a plurality of opaque metal electrodes on an insulating substrate to form a one-dimensional array electrode, thereby providing said substrate on which said photoconductor film and said transparent electrode are then formed.

23. A method of manufacturing a photosensor according to claim 19, further comprising the step of forming switches arranged in a two-dimensional array in a semiconductor substrate to prepare said substrate, each of said switches having a terminal exposed on a surface of the semiconductor substrate.

24. A method of manufacturing a solar battery comprising the steps of:

forming a photoconductor film of amorphous material made chiefly of silicon and containing hydrogen on a substrate, the photoconductor film including at least one diode structure;

forming a transparent conductive film capable of transmitting light and of conducting electricity on said photoconductor film by sputtering; and heating the resultant structure to a temperature of at least about 140° C. and not greater than about 280° C.

25. A method of manufacturing a one-dimensional photosensor comprising the steps of:

preparing an insulating substrate;

forming a photoconductor film of amorphous material made chiefly of silicon and containing hydrogen on the substrate;

forming a transparent conductive film capable of transmitting light and of conducting electricity on said photoconductor film by sputtering; and heating said photosensor with said transparent conductive film to temperatures of at least about 140° C. and not greater than about 280° C.

26. A method of manufacturing an image sensor comprising the steps of:

preparing a silicon substrate;

forming a photoconductor film of amorphous material made chiefly of silicon and containing hydrogen on the substrate;

forming a transparent conductive film capable of transmitting light and of conducting electricity on said photoconductor film by sputtering to form a photosensor; and heating said photosensor with said transparent conductive film to temperatures of at least about 140° C. and not greater than about 280° C.

27. A method of manufacturing a photosensor according to claim 1, wherein said transparent conductive film is formed by sputtering at least one metal or metal oxide onto said photoconductor film.

* * * * *